United States Patent
Lee et al.

(10) Patent No.: US 10,020,356 B2
(45) Date of Patent: Jul. 10, 2018

(54) ORGANIC LIGHT-EMITTING DIODE DISPLAY DEVICE

(71) Applicant: LG Display Co., Ltd., Seoul (KR)

(72) Inventors: A-Ryoung Lee, Seoul (KR); Ki-Soub Yang, Gyeonggi-do (KR); Da-Hye Shim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/395,042

(22) Filed: Dec. 30, 2016

(65) Prior Publication Data

US 2017/0194414 A1 Jul. 6, 2017

(30) Foreign Application Priority Data

Dec. 30, 2015 (KR) .................. 10-2015-0189787
Dec. 1, 2016 (KR) .................. 10-2016-0162704

(51) Int. Cl.
*H01L 27/32* (2006.01)
*H01L 51/00* (2006.01)
*H01L 51/50* (2006.01)

(52) U.S. Cl.
CPC ...... *H01L 27/3276* (2013.01); *H01L 27/3211* (2013.01); *H01L 27/3246* (2013.01); *H01L 51/0003* (2013.01); *H01L 51/5012* (2013.01)

(58) Field of Classification Search
CPC ............ H01L 27/3276; H01L 27/3211; H01L 27/3246; H01L 51/0003; H01L 51/5012
See application file for complete search history.

(56) References Cited

U.S. PATENT DOCUMENTS

| | | | |
|---|---|---|---|
| 7,989,850 B2 * | 8/2011 | Choi | G02F 1/1368 257/204 |
| 8,587,194 B2 * | 11/2013 | Lee | H01L 27/12 257/59 |
| 9,318,542 B2 * | 4/2016 | Choi | H01L 27/3246 |
| 9,318,612 B2 * | 4/2016 | Seo | H01L 29/78606 |
| 9,640,774 B2 * | 5/2017 | Lee | H01L 51/5016 |
| 2006/0158095 A1 | 7/2006 | Imamura | |

(Continued)

FOREIGN PATENT DOCUMENTS

JP 2006-201421 A 8/2006
JP 2010-231079 A 10/2010

(Continued)

OTHER PUBLICATIONS

Combined Search and Examination Report dated Apr. 26, 2017, issued by the United Kingdom Intellectual Property Office for corresponding United Kingdom Patent Application No. 1622104.6.

(Continued)

*Primary Examiner* — Nicholas Tobergte
(74) *Attorney, Agent, or Firm* — Morgan, Lewis & Bockius LLP

(57) ABSTRACT

Provided is an organic light-emitting display device. An organic light-emitting display device (OLED) includes: a substrate including at least three pixel regions arranged in a horizontal direction, a first electrode in each pixel region on the substrate, a bank surrounding each pixel region, and a power line in the horizontal portion at a lower side of each pixel region on the substrate, the power line being configured to supply a driving voltage to each pixel region.

29 Claims, 15 Drawing Sheets

(56) References Cited

U.S. PATENT DOCUMENTS

| | | |
|---|---|---|
| 2009/0017230 A1 | 1/2009 | Tudhope et al. |
| 2009/0232970 A1 | 9/2009 | Kidu |
| 2011/0062859 A1* | 3/2011 | Kawamura ........... H01L 27/322 |
| | | 313/504 |
| 2014/0027743 A1 | 1/2014 | Nishido |
| 2014/0138651 A1 | 5/2014 | Oh |
| 2014/0139102 A1* | 5/2014 | Jeon ................... H01L 27/3246 |
| | | 313/504 |
| 2015/0001486 A1* | 1/2015 | Kim .................... H01L 27/3246 |
| | | 257/40 |
| 2015/0090988 A1 | 4/2015 | Oooka et al. |
| 2015/0102332 A1 | 4/2015 | Shin et al. |
| 2015/0137099 A1 | 5/2015 | Choi |
| 2015/0155520 A1 | 6/2015 | Kim et al. |

FOREIGN PATENT DOCUMENTS

| | | |
|---|---|---|
| JP | 2012-003088 A | 1/2012 |
| JP | 2012-058664 A | 3/2012 |
| JP | 2012-234748 A | 11/2012 |
| JP | 2014-044936 A | 3/2014 |
| TW | 201421674 A | 6/2014 |
| TW | 201517253 A | 5/2015 |
| TW | 201521002 A | 6/2015 |
| TW | 201523962 A | 6/2015 |

OTHER PUBLICATIONS

Japanese Office Action dated Nov. 2, 2017, issued in corresponding Japanese Application No. 2016-254683.
Taiwanese Office Action dated Oct. 30, 2017, issued in corresponding Taiwanese Application No. 105143716.

* cited by examiner

ORGANIC LIGHT-EMITTING DIODE DISPLAY DEVICE

CROSS-REFERENCE TO RELATED APPLICATION(S)

This application claims the benefit of Korean Patent Applications No. 10-2015-0189787, filed on Dec. 30, 2015, and No. 10-2016-0162704, filed on Dec. 1, 2016, the entire disclosure of each of which is hereby incorporated by reference herein.

BACKGROUND

1. Technical Field

The present disclosure relates to an organic light-emitting diode display device (OLED), and more particularly, to an OLED that can improve a uniformity of thickness of an organic light-emitting layer.

2. Discussion of the Related Art

Recently, flat display devices, such as a plasma display panel (PDP), a liquid crystal display device (LCD), and an organic light-emitting diode display device (OLED), have been researched. Among the flat display devices, the OLED is a self-luminescent device and can have a thin profile because the OLED does not need a backlight, such as that used for the LCD.

Further, compared with the LCD, the OLED has advantages of excellent viewing angle and contrast ratio, low power consumption, operation in low DC voltage, fast response speed, being strong to resist an external impact because of its solid internal components, and wide operating temperature range. Particularly, because processes of manufacturing the OLED are simple, production cost of the OLED can be reduced more that of the LCD.

FIG. 1 is a plan view illustrating an OLED according to the related art. FIG. 2A is a cross-sectional view taken along line IIa-IIa of FIG. 1. FIG. 2B is a cross-sectional view taken along line IIb-IIb of FIG. 1.

With reference to FIGS. 1 to 2B, the related art OLED includes a substrate 11, including first to third pixel regions P1 to P3 arranged in a horizontal direction, a planarization layer 17 on the substrate 11, a first electrode 20 on the planarization layer 17 and located in each of first to third pixel regions P1 to P3, and a bank 50 covering an edge portion of the first electrode 20 and surrounding each of the first to third pixel regions P1 to P3 on the planarization layer 17. The OLED further includes a power line 13 and a data line 15 in a vertical direction at boundary portions B1 and B2 among the first to third pixel regions P1 to P3, and a gate line 14 crossing the power line 13 and the data line 15 and located at a lower side of the first to third pixel regions P1 to P3. A gate insulating layer 12 is on the substrate 11 covering the gate line 14, and the planarization layer 17 is on the gate insulating layer 12 covering the power line 13 and the data line 15.

When the OLED operates, a driving voltage is supplied to the first to third pixel regions P1 to P3 through one power line 13. Accordingly, the driving voltage drops. Thus, display quality is degraded.

To prevent the driving voltage drop, a width of the first boundary portion B1 between the first and second pixel regions P1 and P2 is greater than that of the second boundary portion B2 between the second and third pixel regions P2 and P3, the power line 13 is arranged on the gate insulating layer 12 at the first boundary portion B1, and the data line 15 is arranged on the gate insulating layer at the second boundary portion B2. Accordingly, a width of the power line 13 becomes great in correspondence to the width of the first boundary portion B1. Thus, even for a large-sized OLED, a driving voltage drop is minimized, and degradation of display quality is prevented.

A width of the bank 50 at the first boundary portion B1 is greater than that of the bank 50 at the second boundary portion B2. Organic light-emitting layers 70a to 70c are formed on respective first pixel electrodes 20. The organic light-emitting layers 70a to 70c are formed using a soluble process method, such as an inject printing method, a nozzle printing method, or the like.

In detail, with reference to FIGS. 2A and 2B, an organic light-emitting material solution is dropped on the first electrode 20 of each of the first to third pixel regions P1 to P3, then the dropped organic light-emitting material solution is dried. Thus, the organic light-emitting layers 70a to 70c are formed. In this case, the width of the bank 50 at the first boundary portion B1 is greater than that of the bank 50 at the second boundary portion B2.

Accordingly, for the dropped organic light-emitting material solution in each of the first to third pixel regions P1 to P3, an evaporation environment of solvent molecules of the organic light-emitting material solutions located at respective sides of the first and second pixel regions P1 and P2 with the first boundary portion B1 therebetween is different from an evaporation environment of solvent molecules of the organic light-emitting material solutions located at respective sides of the second and third pixel regions P2 and P3 with the second boundary portion B2.

In other words, when drying the organic light-emitting material solutions, an evaporation rate of the solvent molecules of the organic light-emitting material solutions located at adjacent sides of the first and second pixel regions P1 and P2 is faster than an evaporation rate of the solvent molecules of the organic light-emitting material solutions located at adjacent sides of the second and third pixel regions P2 and P3.

Accordingly, after drying the organic light-emitting material solutions, unlike the organic light-emitting layer 70c formed in the third pixel region P3, the organic light-emitting layers 70a and 70b formed in the first and second pixel regions P1 and P2 become thicker where they are closer to the first boundary portion B1. Such non-uniformity of thickness of the organic light-emitting layers 70a to 70c causes degradation of display quality of the OLED and reduction of light emission efficiency and lifetime of the OLED.

SUMMARY

Accordingly, the present disclosure is directed to an organic light-emitting display device that substantially obviates one or more of the problems due to limitations and disadvantages of the related art.

An object of the present disclosure is to improve a uniformity of thickness of an organic light-emitting layer and a non-uniformity of brightness.

Additional features and advantages will be set forth in the description that follows, and in part will be apparent from the description, or may be learned by practice of the invention. The objectives and other advantages of the disclosure will be realized and attained by the structure particularly pointed out in the written description and claims thereof as well as the appended drawings.

To achieve these and other advantages and in accordance with the purpose of the present disclosure, as embodied and broadly described, there is provided an organic light-emitting display device (OLED), including: a substrate including at least three pixel regions arranged in a horizontal direction, a first electrode in each pixel region on the substrate, a bank surrounding each pixel region, and a power line in the horizontal portion at a lower side of each pixel region on the substrate, the power line being configured to supply a driving voltage to each pixel region.

In another aspect, there is provided an organic light-emitting display device (OLED), including: a substrate including: a plurality of gate lines and data lines crossing each other, and at least three pixel regions arranged in a horizontal direction at crossing portions of the gate and data lines, a first electrode in each pixel region on the substrate, a bank surrounding each pixel region, and a power line in parallel with the gate line, the power line being configured to supply a driving voltage to each pixel region.

In another aspect, there is provided an organic light-emitting display device (OLED), including: a substrate including pixel regions emitting a same color on each column line, a first electrode in each pixel region on the substrate, a bank surrounding each pixel group including neighboring pixel regions on each column line, and an organic light-emitting layer on the first electrode and corresponding to each pixel group.

In another aspect, there is provided an organic light-emitting display device, including: organic light-emitting display device (OLED), including: a substrate including pixel regions emitting a same color on each column line, a first electrode in each pixel region on the substrate, a bank between neighboring pixel regions on each column line, the bank including: a first part, and second parts at each side of the first part and each having a thickness less than that of the first part, and an organic light-emitting layer on the first electrode and the second parts.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the disclosure.

Figure 1:
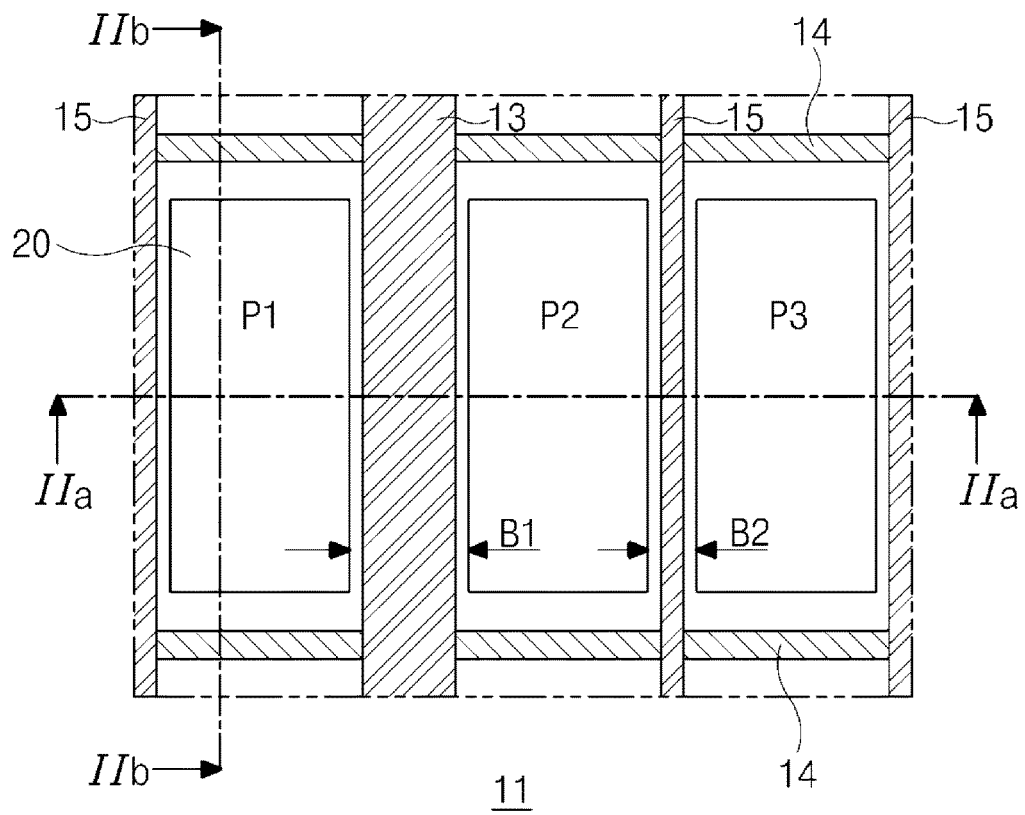
FIG. 1 is a plan view illustrating an OLED according to the related art.
Figure 2A:
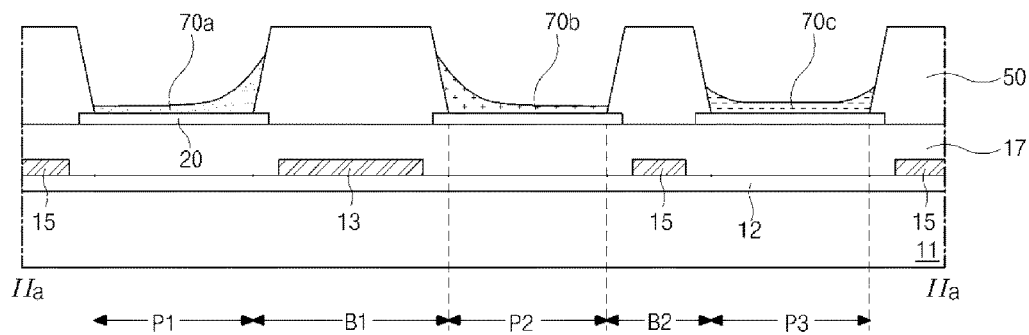
FIG. 2A is a cross-sectional view taken along line IIa-IIa of FIG. 1.
Figure 2B:
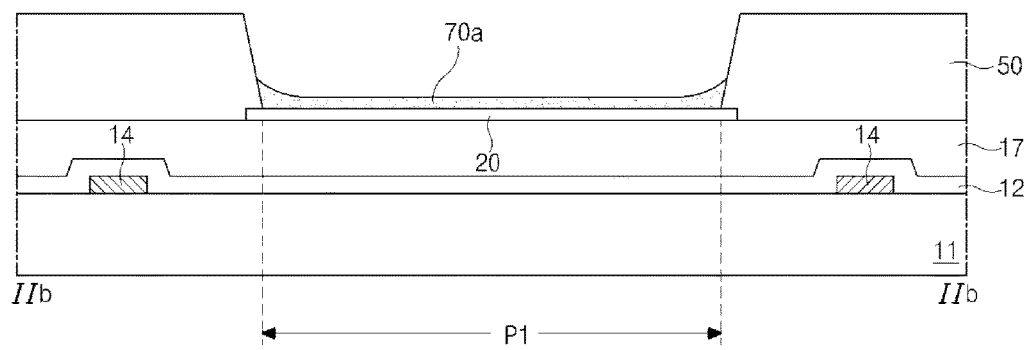
FIG. 2B is a cross-sectional view taken along line IIb-IIb of FIG. 1.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

<First Embodiment>

Figure 3:
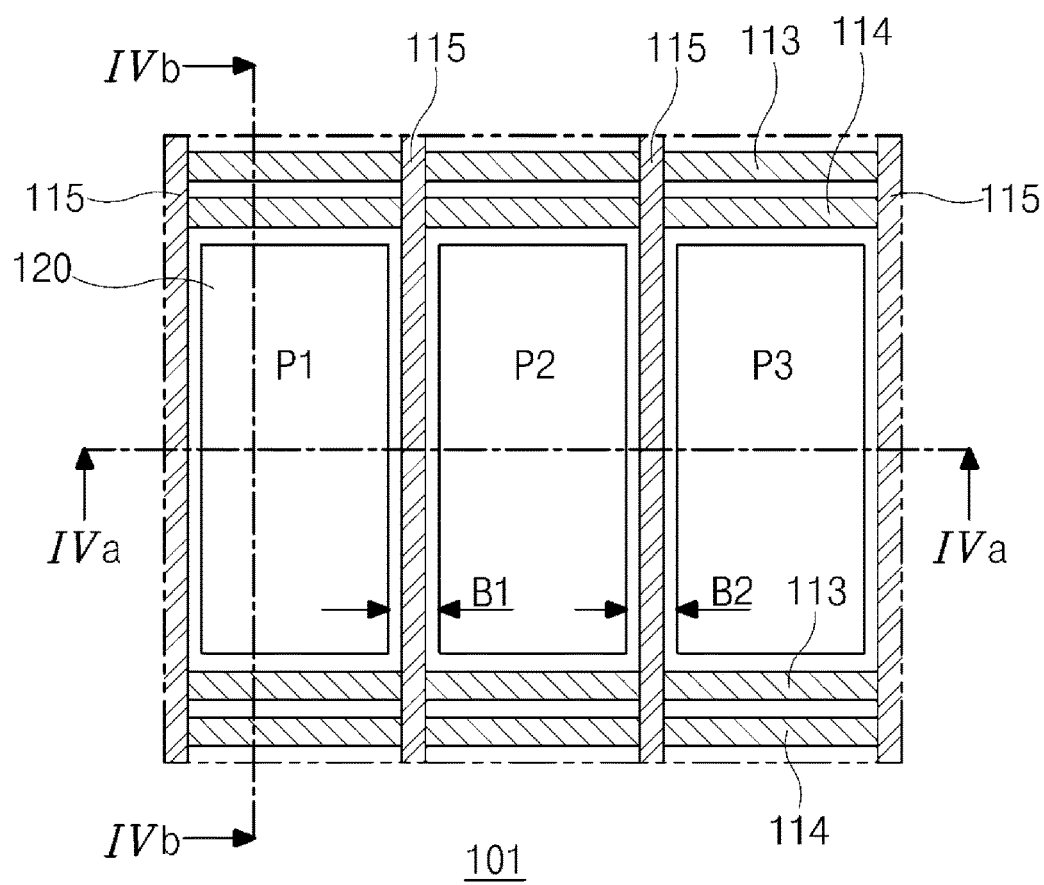
FIG. 3 is a plan view illustrating an OLED according to a first embodiment of the present disclosure.
Figure 4A:
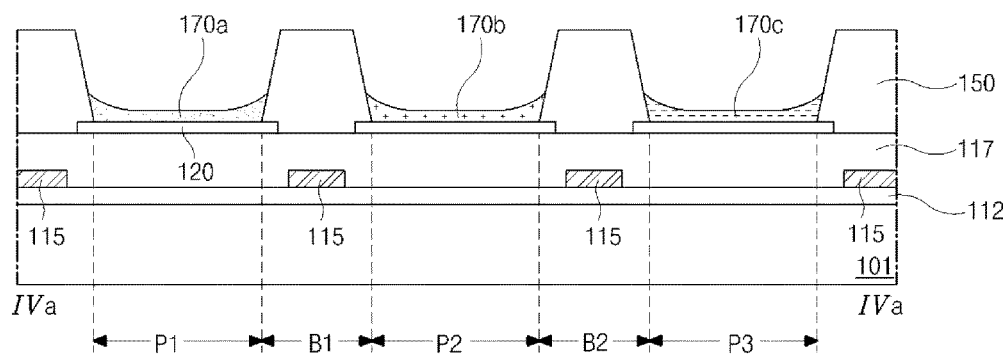
FIG. 4A is a cross-sectional view taken along line IVa-IVa of FIG. 3.
Figure 4B:
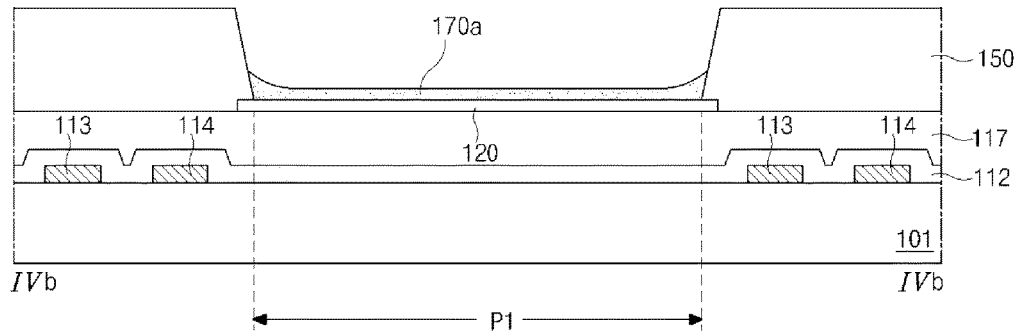
FIG. 4B is a cross-sectional view taken along line IVb-IVb of FIG. 3.

FIG. 3 is a plan view illustrating an OLED according to a first embodiment of the present disclosure. FIG. 4A is a cross-sectional view taken along line IVa-IVa of FIG. 3. FIG. 4B is a cross-sectional view taken along line IVb-IVb of FIG. 3.

With reference to FIG. 3, the OLED of the first embodiment may include a substrate 101 including first to third pixel regions P1 to P3 arranged in a horizontal direction, a first electrode 120 in each of first to third pixel regions P1 to P3 on the substrate 101, and a gate line 114, a data line 115, and a power line 113 on the substrate 101. The substrate 101 may include three or more pixel regions. In one example, a fourth pixel region may be arranged at one side of the first to third pixel regions P1 to P3.

For example, the gate line 114 may be arranged in the horizontal direction at a lower side of the first to third pixel regions P1 to P3. The data line 115 may cross the gate line 114, and may be arranged at each of boundary portions B1 and B2 among the first to third pixel regions P1 to P3. The power line 113 may be arranged at the lower side of the first to third pixel regions P1 to P3, and may be spaced part from and parallel with the gate line 114.

With reference to FIGS. 4A and 4B, the OLED may further include a bank 150 on a planarization layer 117. The bank 150 may cover an edge portion of the first electrode 120, and may surround each of the first to third pixel regions P1 to P3. The OLED may further include a gate insulating layer 112 located on the substrate 101 and covering the power line 113 and the gate line 114, and the planarization layer 117 on the gate insulating layer 112.

The data line 115 may be between the gate insulating layer 112 and the planarization layer 117, and the first electrode 120 is be on the planarization layer 117. The power line 113 and the gate line 114 may be formed at the same layer and of the same material. The first electrode 120 may be formed of a transparent conductive material having a relatively high work function to serve as an anode. The bank 150 may be formed of a hydrophobic material.

To achieve a large-sized OLED, the plurality of pixel regions P1 to P3 may be supplied with a driving voltage through one power line 113. This may cause the driving voltage drop and degradation of display quality.

In the OLED of the first embodiment, the power line 113 may be arranged in the horizontal direction at the lower side of the first to third pixel regions P1 to P3, and a driving voltage may be supplied from both ends of the power line 113. Thus, the driving voltage drop can be prevented. Accordingly, even when achieving the large-sized OLED, the driving voltage drop can be minimized, and degradation of display quality can be prevented.

Because the driving voltage is supplied from both ends of the power line 113, a width of the power line 113 can be reduced along with minimizing the driving voltage drop. Thus, reduction of aperture ratio due to the arrangement of the power line 113 can be minimized.

Organic light-emitting layers 170a to 170c may be formed on respective first electrodes 120. The organic light-emitting layers 170a to 170c may be laminated using a soluble process method, such as an inject printing method, a nozzle printing method, or the like.

For example, an organic light-emitting material solution may be dropped on the first electrode 120 of each of the first to third pixel regions P1 to P3, then the dropped organic light-emitting material solution may be dried. Thus, the organic light-emitting layers 170a to 170c may be formed. Because the bank 150 may be hydrophobic, the bank 150 may function as a partition wall to prevent the organic light-emitting material solutions dropped on the first to third pixel regions P1 to P3 from being mixed.

Further, the data line 115 may be arranged at the boundary portions B1 and B2 among the first to third pixel regions P1 to P3, and the power line 113 may be arranged at the lower side of the first to third pixel regions P1 to P3. Thus, a width of the first boundary portion B1 and a width of the second boundary portion B2 may be equal to each other, and a width of the bank 150 at the first boundary portion B1 and a width of the bank 150 at the second boundary portion B2 may be equal to each other.

When the widths of the first and second boundary portions B1 and B2 are equal to each other, amounts of organic light-emitting material solutions around minor axes of the first to third pixel regions P1 to P3 may be equal to each other. Accordingly, in a process of drying the organic light-emitting material solution, evaporation rates of solvent molecules of the organic light-emitting material solutions in the minor axes of the first to third pixel regions P1 to P3 may be equal to each other.

Further, after the drying process, thicknesses of the organic light-emitting layers 170a to 170c in the minor axes of the first to third pixel regions P1 to P3 may be uniform. Accordingly, degradation of display quality of the OLED can be prevented, and reduction of light emission efficiency and lifetime of the OLED can be prevented.

<Second Embodiment>

Figure 5:
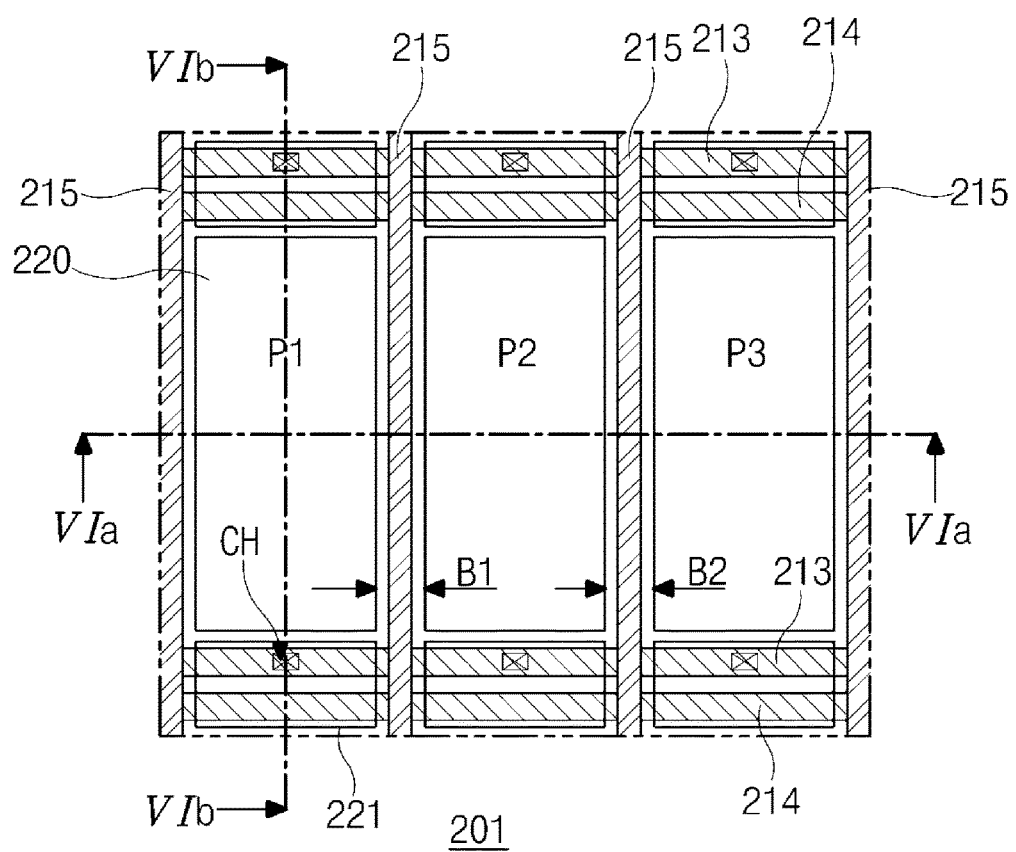
FIG. 5 is a plan view illustrating an OLED according to a second embodiment of the present disclosure.
Figure 6A:
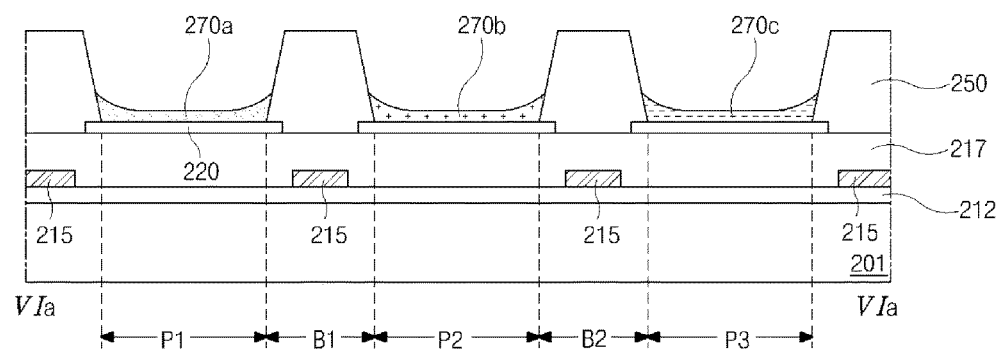
FIG. 6A is a cross-sectional view taken along line VIa-VIa of FIG. 5.
Figure 6B:
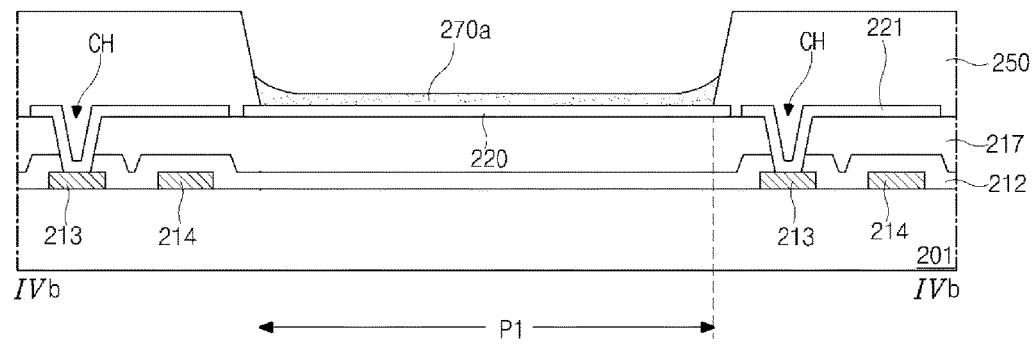
FIG. 6B is a cross-sectional view taken along line VIb-VIb of FIG. 5.

FIG. 5 is a plan view illustrating an OLED according to a second embodiment of the present disclosure. FIG. 6A is a cross-sectional view taken along line VIa-VIa of FIG. 5. FIG. 6B is a cross-sectional view taken along line VIb-VIb of FIG. 5.

With reference to FIG. 5, the OLED of the second embodiment may include a substrate 201 including first to third pixel regions P1 to P3 arranged in a horizontal direction, a first electrode 220 in each of first to third pixel regions P1 to P3 on the substrate 201, and a gate line 214, a data line 215, and a power line 213 on the substrate 201. The substrate 201 may include three or more pixel regions. In one example, a fourth pixel region may be arranged at one side of the first to third pixel regions P1 to P3. Further, the OLED may include an auxiliary electrode 221 located at a boundary portion between pixel regions along a vertical direction and spaced apart from the first electrode 220.

For example, the gate line 214 may be arranged in the horizontal direction at a lower side of the first to third pixel regions P1 to P3. The data line 215 may cross the gate line 214, and may be arranged at each of boundary portions B1 and B2 among the first to third pixel regions P1 to P3. The power line 213 may be arranged at the lower side of the first to third pixel regions P1 to P3, and may be spaced part from and parallel with the gate line 214. The power line 213 may be electrically connected with the auxiliary electrode 221 through a contact hole CH.

With reference to FIGS. 6A and 6B, the OLED may further include a bank 250 on a planarization layer 217. The bank 250 may cover an edge portion of the first electrode 220, and may surround each of the first to third pixel regions P1 to P3.

The OLED may further include a gate insulating layer 212 located on the substrate 201 and covering the power line 213 and the gate line 214, and the planarization layer 217 on the gate insulating layer 212. The data line 215 may be between the gate insulating layer 212 and the planarization layer 217, and the first electrode 220 and the auxiliary electrode 221 may be on the planarization layer 217.

The gate insulating layer 212 and the planarization layer 217 may include a contact hole CH exposing a portion of the power line 213, and the auxiliary electrode 221 may be connected with the power line 213 through the contact hole CH. The auxiliary electrode may be connected to a driving thin film transistor.

The power line 213 and the gate line 214 may be formed at the same layer and of the same material. The first electrode 220 and the auxiliary electrode 221 may be formed at the same layer and of the same material. The first electrode 220 may be formed of a transparent conductive material having a relatively high work function to serve as an anode. The bank 250 may be formed of a hydrophobic material.

To achieve a large-sized OLED, the plurality of pixel regions P1 to P3 may be supplied with a driving voltage through one power line 213. This may cause the driving voltage drop and degradation of display quality.

In the OLED of the second embodiment, the power line 213 may be arranged in the horizontal direction at the lower side of the first to third pixel regions P1 to P3, and a driving voltage may be supplied from both ends of the power line 213. Thus, the driving voltage drop can be prevented. Accordingly, even when achieving the large-sized OLED, the driving voltage drop can be minimized, and degradation of display quality can be prevented.

Because the driving voltage is supplied from both ends of the power line 213, a width of the power line 213 can be reduced along with minimizing the driving voltage drop. Thus, reduction of aperture ratio due to the arrangement of the power line 213 can be minimized.

Further, because the power line 213 is electrically connected with the auxiliary electrode 221 through the contact hole CH, a sheet resistance of the power line 213 may be reduced. A width of the power line 213 can be reduced as much as the sheet resistance of the power line is reduced. Thus, reduction of aperture ratio can be further minimized.

Organic light-emitting layers 270a to 270c may be formed on respective first electrodes 220. The organic light-emitting layers 270a to 270c may be laminated using a soluble process method, such as an inject printing method, a nozzle printing method or the like.

For example, an organic light-emitting material solution may be dropped on the first electrode 220 of each of the first to third pixel regions P1 to P3, then the dropped organic light-emitting material solution may be dried. Thus, the organic light-emitting layers 270a to 270c may be formed. Because the bank 250 is hydrophobic, the bank 250 may function as a partition wall to prevent the organic light-emitting material solutions dropped on the first to third pixel regions P1 to P3 from being mixed.

Further, the data line 215 may be arranged at the boundary portions B1 and B2 among the first to third pixel regions P1 to P3, and the power line 213 may be arranged at the lower side of the first to third pixel regions P1 to P3. Thus, a width of the first boundary portion B1 and a width of the second boundary portion B2 may be equal to each other, and a width of the bank 250 at the first boundary portion B1 and a width of the bank 250 at the second boundary portion B2 may be equal to each other.

When the widths of the first and second boundary portions B1 and B2 are equal to each other, amounts of organic light-emitting material solutions around minor axes of the first to third pixel regions P1 to P3 may be equal to each other. Accordingly, in a process of drying the organic light-emitting material solution, evaporation rates of solvent molecules of the organic light-emitting material solutions in the minor axes of the first to third pixel regions P1 to P3 may be equal to each other.

Further, after the drying process, thicknesses of the organic light-emitting layers 270a to 270c in the minor axes of the first to third pixel regions P1 to P3 may be uniform. Accordingly, degradation of display quality of the OLED can be prevented, and reduction of light emission efficiency and lifetime of the OLED can be prevented.

<Third Embodiment>

Figure 7:
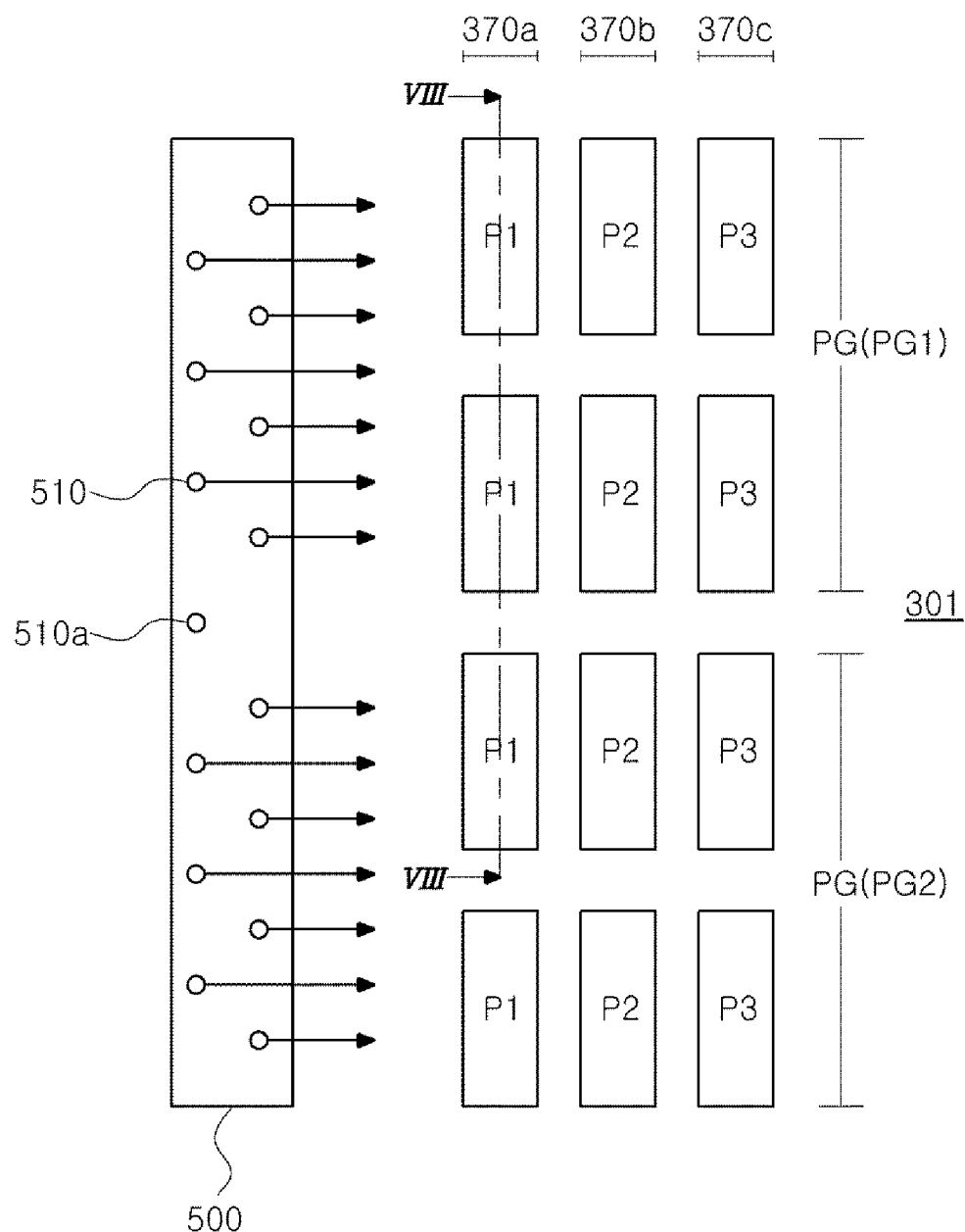
FIG. 7 is a plan view illustrating an OLED according to a third embodiment of the present disclosure.
Figure 8:
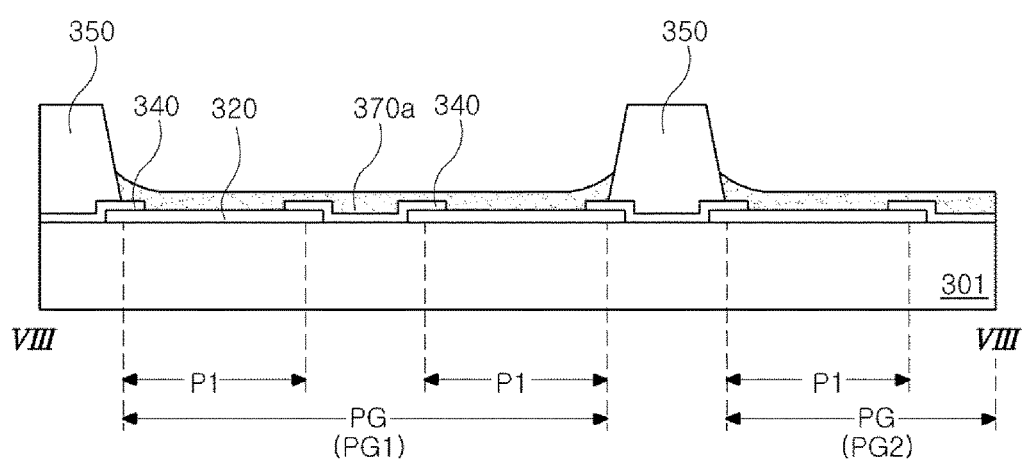
FIG. 8 is a cross-sectional view taken along line VIII-VIII of FIG. 7.

FIG. 7 is a plan view illustrating an OLED according to a third embodiment of the present disclosure. FIG. 8 is a cross-sectional view taken along line VIII-VIII of FIG. 7.

The OLED of the third embodiment is similar to the OLED of the first or second embodiments, except for a structure of pixel regions emitting the same color on each column line. Explanations similar to parts of the first or second embodiment may be omitted. For the purpose of explanation, gate lines, data lines, and power lines, and so on are not shown in FIGS. 7-8.

In the OLED of this embodiment, pixel regions emitting the same color may be located on each column line. For example, the first pixel regions P1 on the first column line may emit red, the second pixel regions P2 on the second column line may emit green, and the third pixel regions Ps on the third column line may emit blue. Embodiments are not limited thereto. The first pixel region P1, the second pixel region P2, and the third pixel region P3 may alternate on each row line. A bank 350 may be formed between the neighboring pixel regions on each row line.

In this embodiment, regarding the pixel regions on each column line, at least two neighboring pixel regions may form a pixel group as a unit group. In this case, no bank may be formed at a boundary portion between the neighboring pixel regions within each pixel group, and the bank 350 may be formed between at a boundary portion between the neighboring pixel group.

This is illustrated with the first pixel regions P1 by way of example. Two neighboring first pixel regions P1 may form each pixel group PG, and the bank 350 may not be formed between the first pixel regions P1 within the pixel group PG. However, the bank 350 may be formed between the neighboring first pixel groups PG, e.g., between an outermost first pixel region P1 of a first pixel group PG1 and an outermost first pixel region P1 of a second pixel group PG2 neighboring to the outermost first pixel region P1 of the first pixel group PG1. In other words, on each column line, the bank 350 may be formed for every at least two pixel regions.

By forming the bank 350 with the pixel group PG including at least two pixel regions on each column line, the bank 350 may surround each pixel group PG. Each of first, second, and third organic light-emitting layers 370a to 370c emitting red, green, and blue, respectively, may be formed corresponding to each pixel group PG. Embodiments are not limited to these examples.

In one example, the pixel group PG emitting red may be surrounded by portions of the bank 350 which may be located at both sides (e.g., an upper side and a lower side) of the column line and both sides (e.g., a left side and a right side) on the row line, and the first organic light-emitting layer 370a may be formed in the bank 350 surrounding each pixel group PG emitting red. Accordingly, a number of the bank portions (e.g., bank patterns) on the column line can be reduced, and a unit region to form each organic light-emitting layer may correspond to the pixel group PG and may increase in area.

Thus, the thickness uniformity of the organic light-emitting layer can be improved, and an efficiency of forming the organic light-emitting layer can be improved. This is explained below in comparison with an comparative example of forming a bank at each pixel region.

Figure 9:
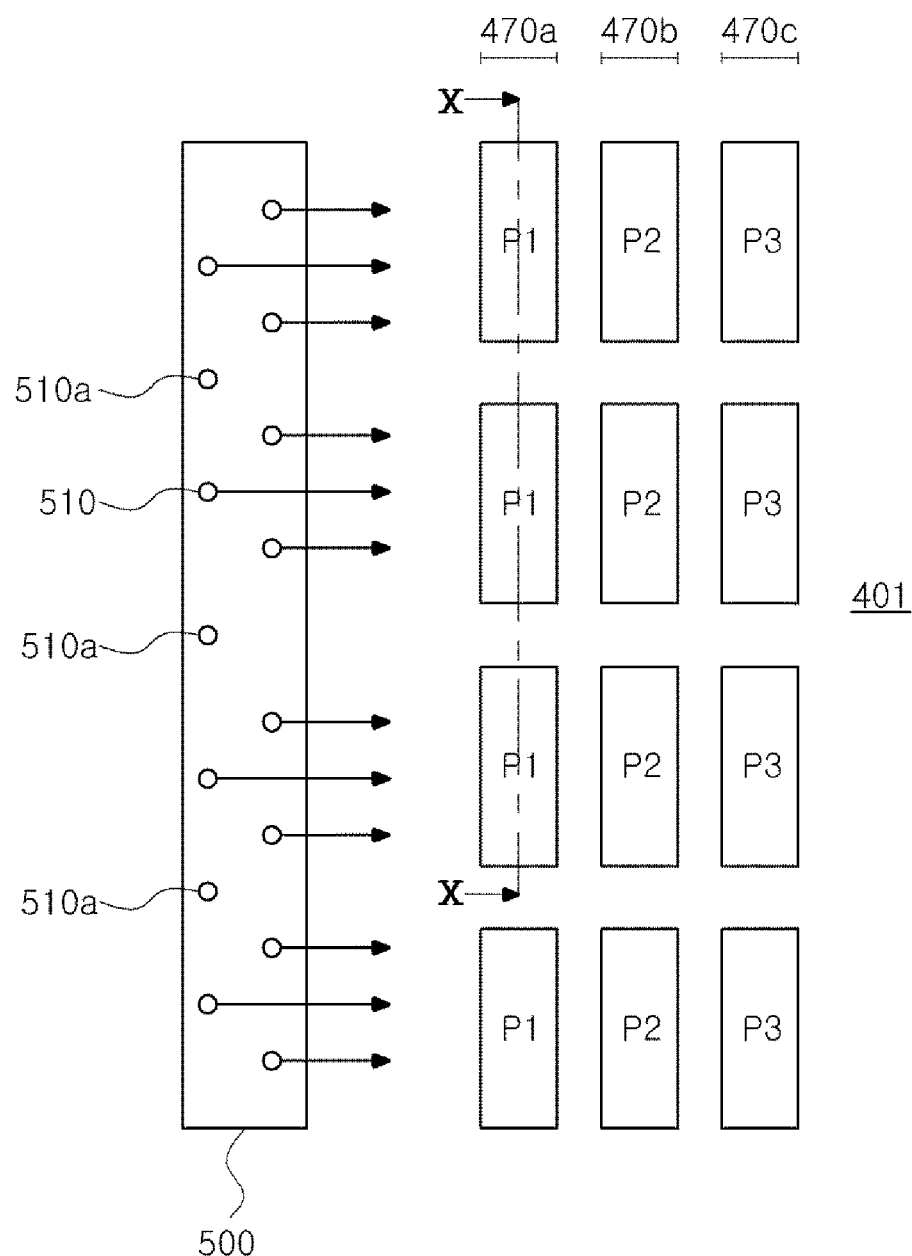
FIG. 9 is a plan view illustrating an OLED of a comparative example.
Figure 10:
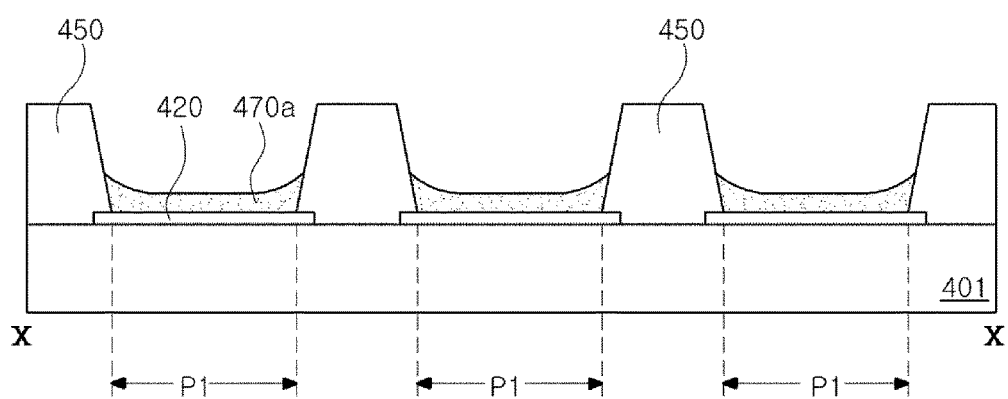
FIG. 10 is a cross-sectional view taken along line X-X of FIG. 9.

FIG. 9 is a plan view illustrating an OLED of a comparative example. FIG. 10 is a cross-sectional view taken along line X-X of FIG. 9.

In the comparative example, because a bank 450 is formed between neighboring pixel regions on each column line, each of first, second, and third organic light-emitting layers 470a and 470c is formed corresponding to every pixel region. Compared with the third embodiment of the present disclosure, the comparative OLED has more bank patterns on each column line, and a unit region to form each organic light-emitting layer is the pixel region and an area of this unit region is smaller.

Accordingly, a thickness profile of the organic light-emitting layer is produced every pixel region in the comparative example. In other words, a profile in which a thickness of the organic light-emitting layer near the bank 450 is greater than a thickness of the organic light-emitting layer inside the pixel region is produced at every pixel region in the comparative example.

In contrast, in the third embodiment, a thickness profile of the organic light-emitting layer is produced at every pixel group that includes a plurality of pixel regions. Thus, compared with the comparative example, the thickness uniformity of the organic light-emitting layer can be greatly improved.

Further, regarding jetting an organic light-emitting material solution through nozzles 510 of an inkjet head 500, the comparative example conducts the jetting at every pixel region. As such, the nozzles 510 located in correspondence to the pixel regions are used, but the nozzles 510a located between the pixel regions are not used. Thus, a use rate of the nozzles 510 is reduced for the comparative example. Further, a number of the used nozzles 510 is limited in a production facility. Therefore, the solution may not be jetted by a required amount, which may cause a spot defect may happen.

In contrast, in the third embodiment, the jetting is conducted at every pixel group. Thus, a number of the used nozzles 510 increases, and a number of the unused nozzles 510a is reduced compared with the comparative example. In the FIG. 9 comparative example, it can be seen that there are more unused nozzles 510a than there are in the example of FIG. 7 for the third embodiment. Accordingly, the use rate of the nozzles 510 increases in an embodiment of the present disclosure, and the solution can be jetted by the required amount. Thus, the spot defect can be prevented according to an embodiment.

Further, in the third embodiment, to obtain an insulation property between first electrodes 320 of the neighboring pixel regions within the pixel group PG, an insulation pattern 340 may be formed. The insulation pattern 340 may be formed of an inorganic insulating material, for example, silicon oxide or silicon nitride. The insulation pattern 340 may be formed between the neighboring first electrodes 320 covering edge portions of the first electrodes 320. Further, the insulation pattern 340 may be formed between the first electrodes 340 neighboring each other on the row line as well.

Further, the configuration of the first or second embodiment may be applied to the OLED of the third embodiment. For example, in the third embodiment, a power line may be formed parallel with a gate line in a row direction. Accordingly, a thickness uniformity of the organic light-emitting layer can be maximized.

Alternatively, the configuration of the related art may be applied to the OLED of the third embodiment. In other words, in the third embodiment, a power line may be formed in a column direction. In this case, because the bank 350 may be formed according to the pixel group PG, the thickness uniformity of the organic light-emitting layer can be improved compared with the related art.

<Fourth Embodiment>

Figure 11:
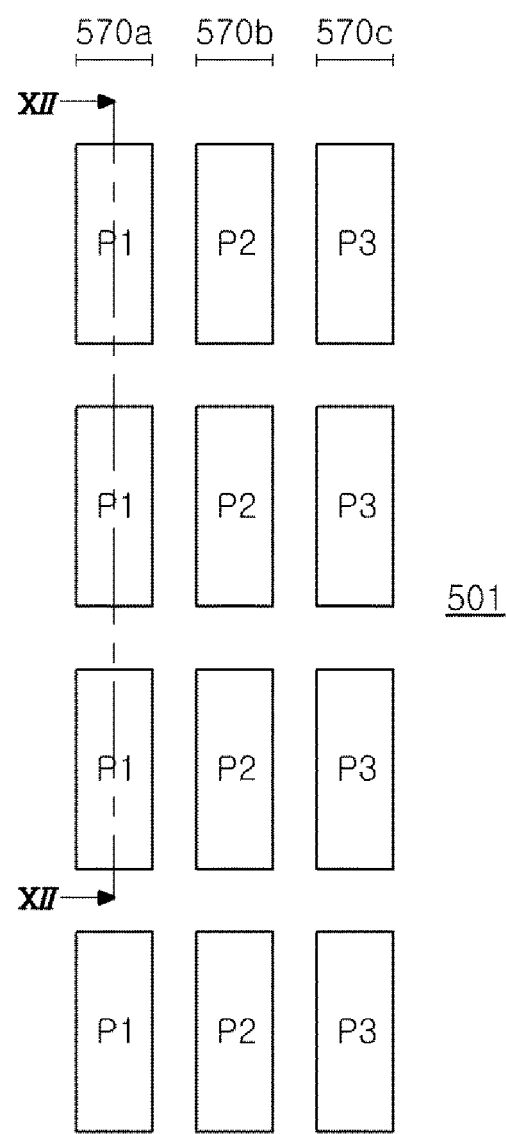
FIG. 11 is a plan view illustrating an OLED according to a fourth embodiment of the present disclosure.
Figure 12:
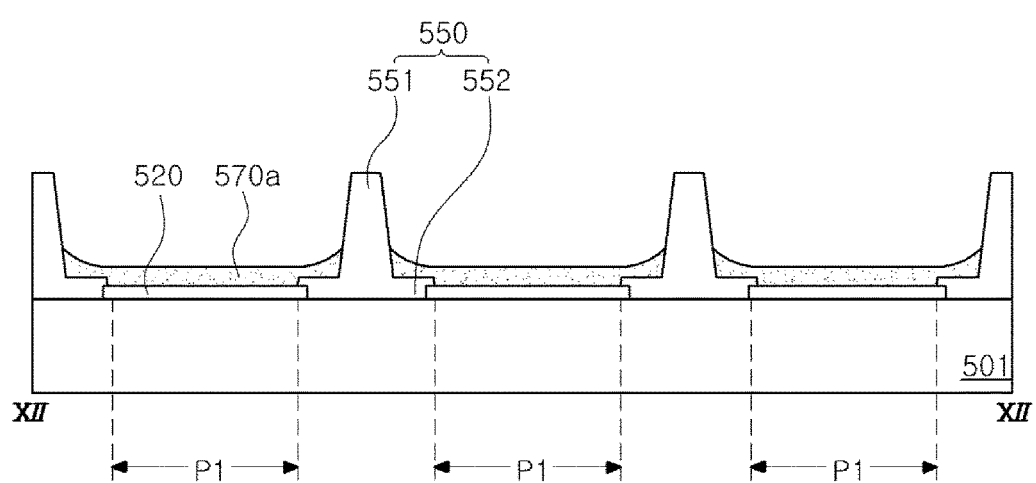
FIG. 12 is a cross-sectional view taken along line XII-XII of FIG. 11.

FIG. 11 is a plan view illustrating an OLED according to a fourth embodiment of the present disclosure. FIG. 12 is a cross-sectional view taken along line XII-XII of FIG. 11.

The OLED of the fourth embodiment is similar to the OLED of the first, second, or third embodiments, except for a structure of pixel regions emitting the same color on each column line. Explanations similar to parts of the first, second, or third embodiments may be omitted. For the purpose of explanations, gate lines, data lines, and power lines, and so on are not shown in FIGS. 11-12.

In the OLED of the fourth embodiment, pixel regions emitting the same color may be located on each column line. For example, the first pixel regions P1 on the first column line may emit red, the second pixel regions P2 on the second column line may emit green, and the third pixel regions P3 on the third column line may emit blue. The first pixel region P1, the second pixel region P2, and the third pixel region P3 may alternate on each row line. A bank 450 may be formed between the neighboring pixel regions on each row line.

In the fourth embodiment, the bank 450 formed between the neighboring pixel regions on each column line may be formed to have a step structure. This is illustrated with the first pixel regions P1 as an example. The bank 450 between the two neighboring first pixel regions P1 may have a first part 551 and second parts 552 at each side, on the column line, of the first part 551. The second part 552 may have a thickness less than that of the first part 551. As such, by the first part 551 being configured to protrude upwardly and the second parts 552 having the lesser thickness, the bank 550 may have the step structure in directions to the first pixel pixels P1 located at both sides thereof.

When the bank 550 has the step structure, the first organic light-emitting layer 570a of the first pixel region P1 may further extend over the second parts 552 located at both sides of the first pixel region P1. Thus, an area to form the first organic light-emitting layer 570a in the first pixel region P1 can expand in the column direction.

Accordingly, compared with a case using a bank having no step structure, a unit area to form the organic light-emitting layer increases. Thus, a thickness uniformity of the organic light-emitting layer can be improved.

Further, the configuration of the first or second embodiment may be applied to the OLED of the fourth embodiment. For example, in the fourth embodiment, a power line may be formed parallel with a gate line in a row direction. Accordingly, a thickness uniformity of the organic light-emitting layer can be maximized.

Alternatively, the configuration of the related art may be applied to the OLED of the fourth embodiment. In other words, in the fourth embodiment, a power line may be formed in a column direction. In this case, because the bank 550 is formed to have the step structure, the thickness uniformity of the organic light-emitting layer can be improved compared with the related art.

It will be apparent to those skilled in the art that various modifications and variations may be made in the present disclosure without departing from the spirit or scope of the invention. Thus, it is intended that embodiments of the present disclosure cover the modifications and variations of this invention provided they come within the scope of the appended claims and their equivalents.

What is claimed is:

1. An organic light-emitting display device (OLED), comprising:
   a substrate including at least three pixel regions arranged in a horizontal direction;
   a first electrode in each pixel region on the substrate;
   a bank surrounding each pixel region;

a power line in the horizontal direction at a lower side of each pixel region on the substrate, the power line being configured to supply a driving voltage to each pixel region; and an auxiliary electrode spaced apart from the first electrode and electrically connected with the power line.

2. The OLED of claim 1, wherein the bank has a same width at boundary portions among the at least three pixel regions.

3. The OLED of claim 1, wherein the driving voltage is supplied from both ends of the power line.

4. The OLED of claim 1, further comprising:
a gate line in the horizontal direction on the substrate; and
a data line crossing the gate line,
wherein the power line and the gate line are at a same layer and are formed of a same material.

5. The OLED of claim 1, further comprising:
a gate insulating layer on the gate line and the power line; and
a planarization layer on the gate insulating layer,
wherein the data line is between the gate insulating layer and the planarization layer, and
wherein the first electrode is on the planarization layer.

6. The OLED of claim 5, wherein:
the gate insulating layer and the planarization layer include a contact hole exposing a portion of the power line; and
the power line is connected to the auxiliary electrode through the contact hole.

7. The OLED of claim 1, further comprising an organic light-emitting layer on the first electrode.

8. The OLED of claim 7, wherein the organic light-emitting layer is laminated using a soluble process.

9. An organic light-emitting display device (OLED), comprising:
a substrate including:
a plurality of gate lines and data lines crossing each other; and
at least three pixel regions arranged in a horizontal direction at crossing portions of the gate and data lines;
a first electrode in each pixel region on the substrate;
a bank surrounding each pixel region; and
a power line in parallel with the gate line, the power line being configured to supply a driving voltage to each pixel region,
wherein the driving voltage is supplied from both ends of the power line.

10. The OLED of claim 9, wherein the bank has a same width at boundary portions among the at least three pixel regions.

11. The OLED of claim 9, wherein the power line and the gate line are at a same layer and are formed of a same material.

12. The OLED of claim 9, further comprising an auxiliary electrode spaced apart from the first electrode and electrically connected with the power line.

13. The OLED of claim 12, further comprising:
a gate insulating layer on the gate line and the power line; and
a planarization layer on the gate insulating layer,
wherein the data line is between the gate insulating layer and the planarization layer, and
wherein the first electrode is on the planarization layer.

14. The OLED of claim 13, wherein:
the gate insulating layer and the planarization layer include a contact hole exposing a portion of the power line; and
the power line is connected to the auxiliary electrode through the contact hole.

15. The OLED of claim 9, further comprising an organic light-emitting layer on the first electrode.

16. The OLED of claim 15, wherein the organic light-emitting layer is laminated using a soluble process.

17. An organic light-emitting display device (OLED), comprising:
a substrate including pixel regions arranged in a first direction, the pixel regions in the first direction emitting a same color;
a first electrode in each pixel region on the substrate;
a bank surrounding each pixel group including at least two neighboring pixel regions in the first direction,
wherein no bank is located between the at least two neighboring pixel regions within each pixel group; and
an organic light-emitting layer on the first electrode and corresponding to each pixel group.

18. The OLED of claim 17, further comprising:
a data line in the first direction;
a gate line in a second direction crossing the first direction; and
a power line in parallel with the gate line.

19. The OLED of claim 18, wherein the bank has a same width at boundary portions among pixel regions emitting different colors in the second direction.

20. The OLED of claim 18, further comprising an auxiliary electrode spaced apart from the first electrode and electrically connected with the power line.

21. The OLED of claim 17, further comprising:
a data line in the first direction;
a gate line in a second direction crossing the first direction; and
a power line in parallel with the data line.

22. The OLED of claim 17, further comprising an insulation pattern between neighboring pixel regions within each pixel group, the insulation pattern covering edge portions of the neighboring pixel regions within each pixel group.

23. The OLED of claim 17, wherein the organic light-emitting layer is laminated using a soluble process.

24. An organic light-emitting display device (OLED), comprising:
a substrate including pixel regions arranged in a first direction, the pixel regions in the first direction emitting a same color;
a first electrode in each pixel region on the substrate;
a bank between neighboring pixel regions in the first direction, the bank including:
a first part; and
second parts at each side of the first part and each having a thickness less than that of the first part; and
an organic light-emitting layer on the first electrode and the second parts.

25. The OLED of claim 24, further comprising:
a data line in the first direction;
a gate line in a second direction crossing the first direction; and
a power line parallel with the gate line.

26. The OLED of claim 25, wherein the bank has a same width at boundary portions among pixel regions emitting different colors in the second direction.

27. The OLED of claim 25, further comprising an auxiliary electrode spaced apart from the first electrode and electrically connected with the power line.

28. The OLED of claim 24, further comprising:
a data line in the first direction;
a gate line in a second direction crossing the first direction; and
a power line parallel with the data line.

29. The OLED of claim 24, wherein the organic light-emitting layer is laminated using a soluble process.

* * * * *